(12) United States Patent
Swirbel

(10) Patent No.: US 7,579,215 B2
(45) Date of Patent: Aug. 25, 2009

(54) METHOD FOR FABRICATING A LOW COST INTEGRATED CIRCUIT (IC) PACKAGE

(75) Inventor: Thomas J. Swirbel, Davie, FL (US)

(73) Assignee: Motorola, Inc., Schaumburg, IL (US)

( * ) Notice: Subject to any disclaimer, the term of this patent is extended or adjusted under 35 U.S.C. 154(b) by 48 days.

(21) Appl. No.: 11/694,744

(22) Filed: Mar. 30, 2007

(65) Prior Publication Data
US 2008/0241998 A1    Oct. 2, 2008

(51) Int. Cl.
H01L 21/56    (2006.01)
H01L 21/60    (2006.01)

(52) U.S. Cl. ............ 438/113; 438/118; 438/126; 438/127; 257/E21.503; 257/E23.119; 257/E23.007; 257/E21.517

(58) Field of Classification Search ............ 438/126, 438/127, 108, 113, 118; 257/E21.503, E23.119, 257/E23.007, E21.517
See application file for complete search history.

(56) References Cited

U.S. PATENT DOCUMENTS

| 5,373,627 | A * | 12/1994 | Grebe | 29/841 |
| 5,567,657 | A * | 10/1996 | Wojnarowski et al. | 438/109 |
| 6,964,887 | B2 * | 11/2005 | Akagawa | 438/126 |
| 2001/0038145 | A1 * | 11/2001 | Mashino | 257/707 |
| 2003/0040143 | A1 * | 2/2003 | Chien et al. | 438/125 |
| 2003/0042035 | A1 * | 3/2003 | Myers et al. | 174/52.2 |
| 2003/0042589 | A1 * | 3/2003 | Hong | 257/686 |
| 2003/0155638 | A1 * | 8/2003 | Ito | 257/678 |
| 2004/0082100 | A1 * | 4/2004 | Tsukahara et al. | 438/106 |
| 2004/0087058 | A1 * | 5/2004 | Ooi et al. | 438/106 |
| 2004/0088416 | A1 * | 5/2004 | Nakatani et al. | 709/226 |
| 2005/0067714 | A1 * | 3/2005 | Rumer et al. | 257/778 |
| 2005/0093170 | A1 | 5/2005 | Kalidas et al. | |
| 2005/0156326 | A1 * | 7/2005 | Ito | 257/779 |
| 2005/0185382 | A1 * | 8/2005 | Ooi et al. | 361/718 |
| 2006/0006553 | A1 * | 1/2006 | Fuller et al. | 257/790 |
| 2006/0134907 | A1 | 6/2006 | Ikeda | |
| 2007/0080434 | A1 * | 4/2007 | Ho et al. | 257/666 |
| 2008/0079157 | A1 * | 4/2008 | Kurita et al. | 257/753 |
| 2008/0241998 | A1 * | 10/2008 | Swirbel | 438/113 |

FOREIGN PATENT DOCUMENTS

EP    1189272  A1    3/2002

OTHER PUBLICATIONS

PCT International Search Report dated Jul. 7, 2008, 16 Pages.

* cited by examiner

Primary Examiner—George Fourson

(57) ABSTRACT

A method for fabricating a low cost integrated circuit package (600) includes separating a processed silicon wafer into a plurality of individual die (601) and then positioning the die (603) on a secondary substrate in a face down position for allowing an increased die I/O connection area. The die is covered (605) with one or more epoxy materials to form a group of embedded die packages. One or more pads on the die are then exposed (615) and subsequently connected (617) to an I/O connection in a die I/O connection area. Each of the die are then separated (619) forming singular embedded die packages from the secondary substrate. The method provides a manufacturing process to form a low cost, very high density integrated circuit package using a combination of both wafer scale packaging and wafer level packaging processes.

14 Claims, 5 Drawing Sheets

METHOD FOR FABRICATING A LOW COST INTEGRATED CIRCUIT (IC) PACKAGE

FIELD OF THE INVENTION

The present invention relates generally to a method of manufacturing integrated circuit (ICs) packages and more particularly to improvements to wafer level IC packaging techniques.

BACKGROUND

Many types of integrated circuit packaging techniques are currently used to increase the yield and efficiency in making highly cost effective electronic components. One such packaging technique that is commonly used is referred to as chip scale packaging. Chip scale packaging involves cutting individual chips from a silicon wafer after the chip has been processed to form an integrated circuit. Each chip is then individually placed one at a time in a package. The package provides mechanical and environmental protection for the chip and enables electrical connections to be made from the chip to other electronic components. In a chip scale package, the chip and the package are substantially the same size with the package typically 0% to 15% larger than the chip by area.

Another process used to package an integrated circuit chip is known as wafer level packaging. Wafer level packaging involves forming the package on the chip before it is cut from the silicon wafer. This process reduces the time needed to package a chip because an entire silicon wafer of chips can be packaged at once prior to cutting the individual chips from the silicon wafer. Thus, a wafer level packaging process reduces the time needed to individually package each chip making it much less costly than chip scale packaging.

FIG. 1 illustrates a silicon wafer 100 comprised of like integrated circuit chips 101, 101', 101" and so forth such that the surface of the silicon wafer 100 is as densely populated with integrated circuit chips as possible. Each integrated circuit chip contains input/output (I/O) pads 102 that enable electrical connection to and from the chip to other devices that are not part of either the chip 101 or the silicon wafer 100. The input output pads 102 must be contained within the surface area of the IC for which they are associated. For ICs with many input/output pads, the pitch or distance 103 between pads can be small and not compatible with the electrical connection capability of other devices such as resistors, capacitors, or printed circuit boards.

Prior art FIG. 2A illustrates a flow chart diagram describing the processes upon which the chip scale package addresses the input/output compatibility with other devices. The flow chart 200 defines the process flow for a chip scale package. The process includes fabricating the IC chips on a silicon wafer 251. The silicon wafer is then cut 253 into individual IC chips and placed onto an interposer substrate 255. An interposer substrate is typically fabricated in 8-up strips using commonly known PCB processes 257. Wire is then bonded from the IC input/output pad to the interposer I/O pad 259. An epoxy mold compound is then overmolded on the IC interposer 261 and the IC and package are then singulated from the strip 263.

FIG. 2B illustrates a prior art diagram of the cross-section the device 201 where an integrated circuit chip 202 uses a wire 203 bonded to the chip. A substrate 204 is used to make electrical connection to interposer substrate 205. The interposer substrate 205 is larger than the chip 202 and redistributes the pitch of the integrated circuit input output pads to a larger pitch that is compatible with electrical connection requirements of resistors, capacitors, or printed circuit boards.

Similarly, prior art FIGS. 3A and 3B illustrate how a wafer level package addresses the input/output compatibility with other devices. Specifically, FIG. 3A is a prior art flow chart 300 that defines the process flow for a wafer level package. This process begins where the IC chips are fabricated on a silicon wafer 351. The silicon wafer is then coated with epoxy dielectric 353 and vias are formed in the epoxy dielectric to expose the IC input/output pad 355. Next, the vias are metalized 357 and the metal input/output pads are formed on the silicon wafer using vias to connect to the IC input/output pads 359. Finally, the IC and package are singulated from the wafer 361.

FIG. 3B illustrates a top view of the device silicon wafer 303. The process as defined in FIG. 3A produces input/output pads 301 compatible with resistors, capacitors, and printed circuit boards. In order to obtain compatible input/output pads 301, the integrated circuits 302, 302', and 302" on silicon wafer 303 are spaced at a distance or pitch 304 such that pitch 304 is greater than pitch 103. The increased pitch 304 requires more silicon area for integrated circuit 302 on silicon wafer 303 than for the same integrated circuit 101 on silicon wafer 100.

Thus, those skilled in the art will recognize that the number of integrated circuits processed on a given silicon wafer will be less for a wafer level package because of the extra space required for the input/output pad pitch. This reduces the overall processing cost since fewer steps are required to make a wafer level packaged integrated circuit as compared with a chip scale packaged IC. Hence, cost saving with few processing steps is negated by the increase in cost associated with the decrease in the total number of ICs processed on the silicon wafer.

In light of the shortcomings of the prior art, the need exists to provide an integrated circuit package processing technique that will yield a substantially high density of integrated circuit chips on the silicon substrate and still provide reduced processing steps for making input/output connections to each individual chip and package.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
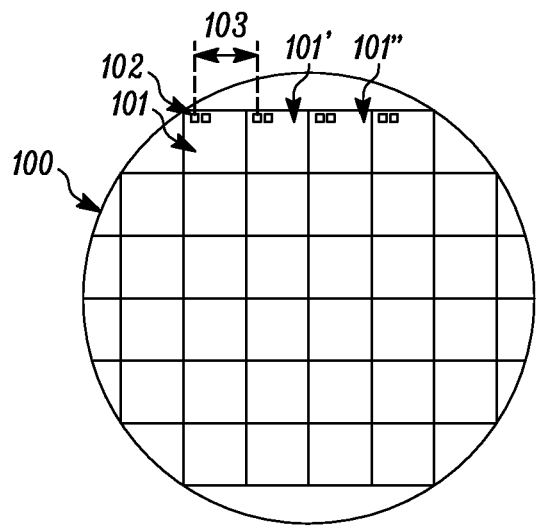
FIG. 1 is a prior art diagram of an integrated circuit chip on a silicon wafer.
Figure 2A:
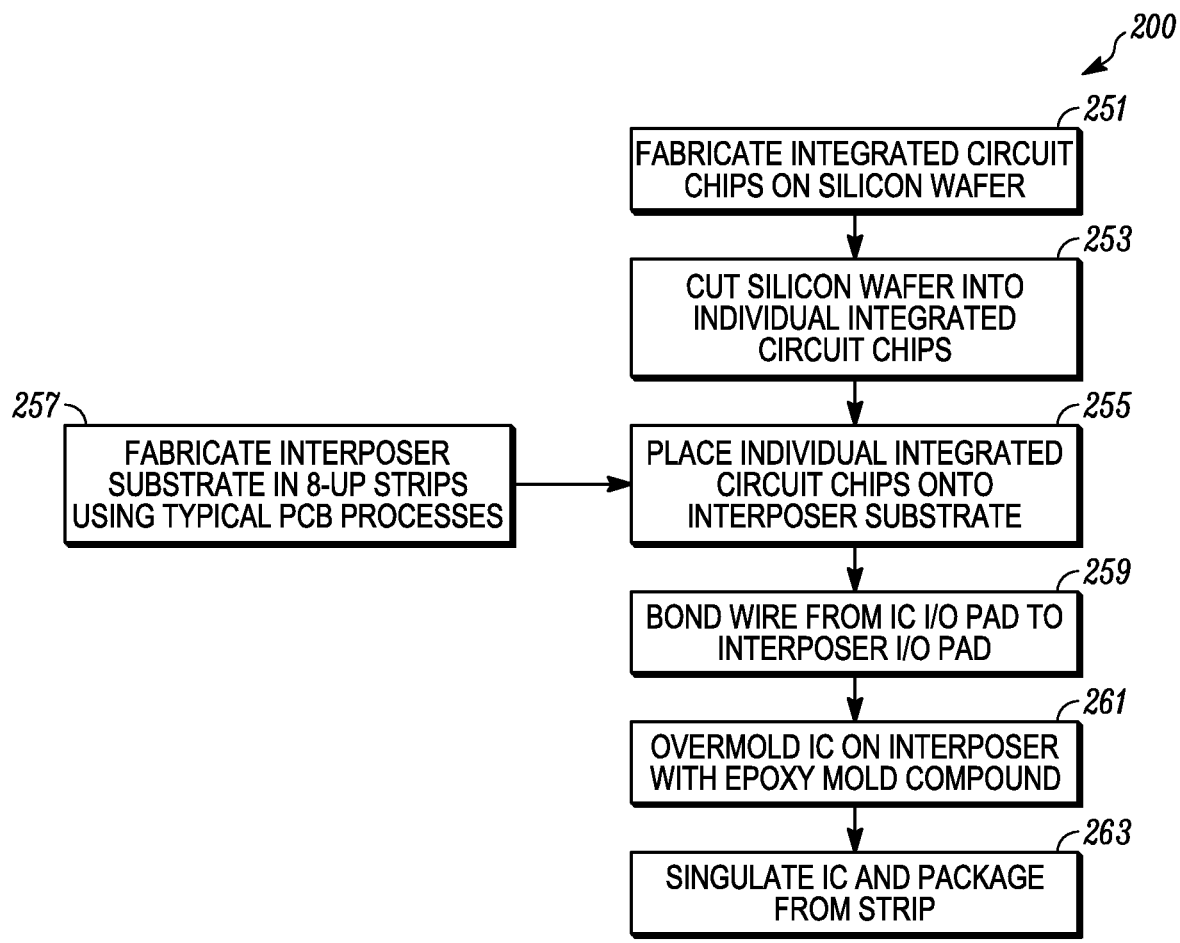
FIG. 2A is a prior art flow chart diagram describing the processes upon which the chip scale IC package addresses the input/output compatibility with other devices.
Figure 2B:
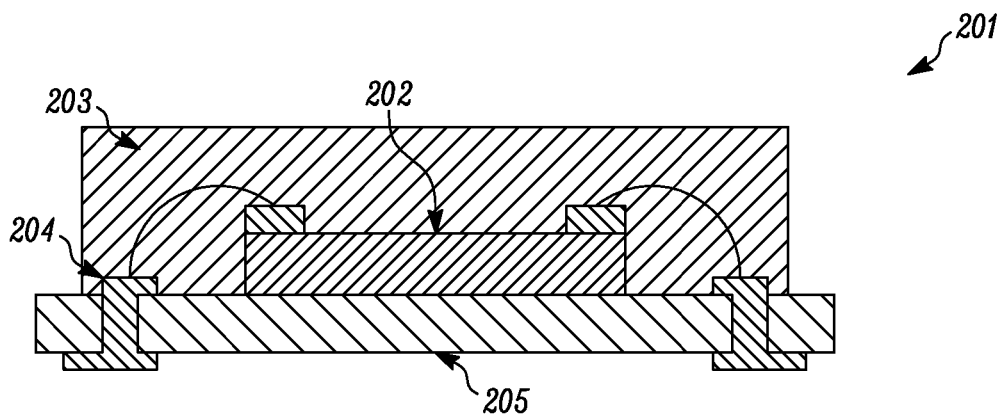
FIG. 2B is a prior art diagram of a chip scale IC package.
Figure 3A:
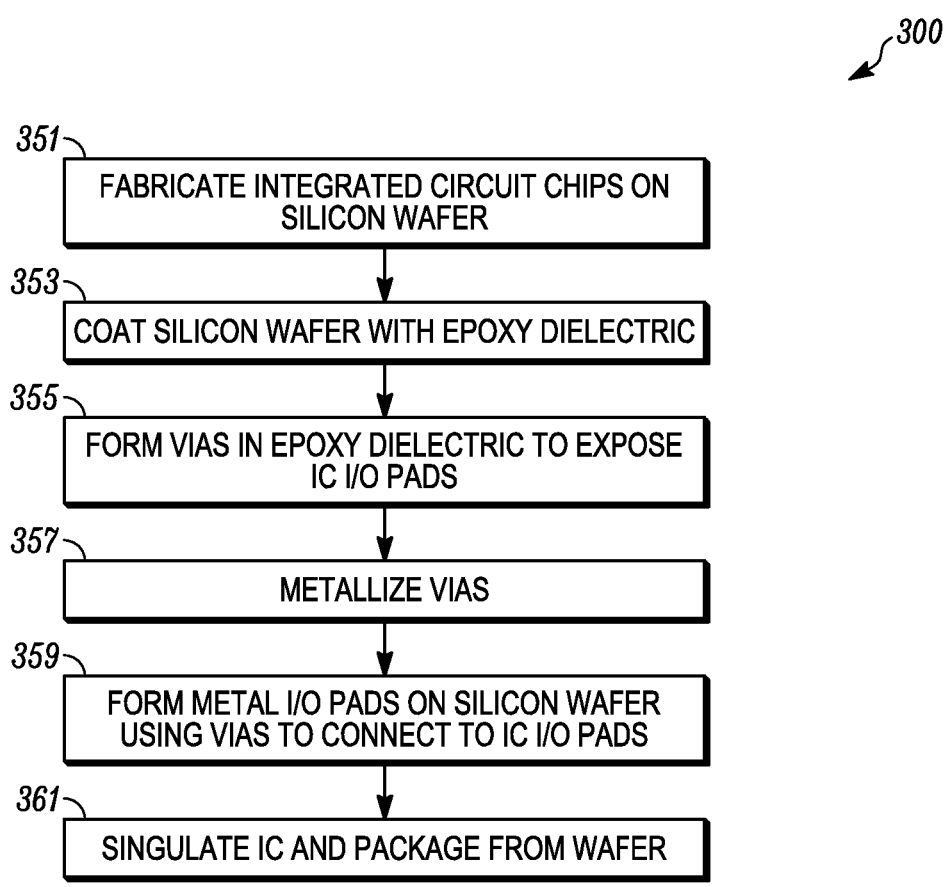
FIG. 3A is a prior art flow chart diagram defining the process flow for a wafer level IC package.
Figure 3B:
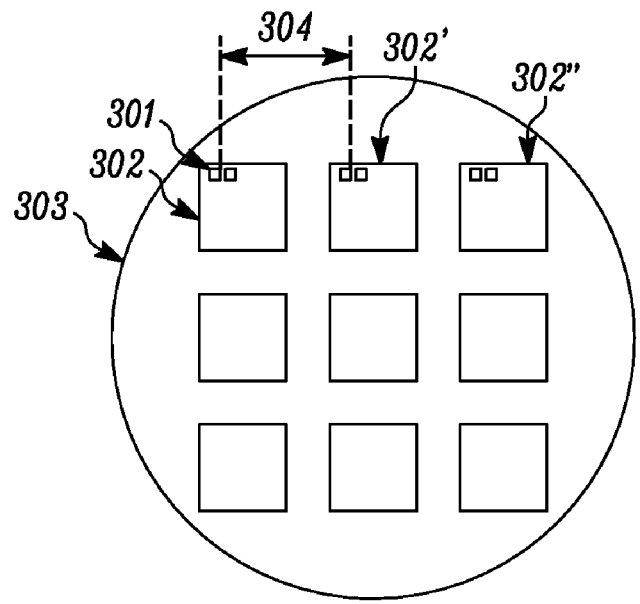
FIG. 3B is a prior art diagram of a wafer scale package

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to integrated circuit packaging. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As will be described in more detail herein, the method of the present invention improves on the current state of integrated circuit (IC) packaging by integrating wafer level packaging with traditional printed circuit board substrate technologies. The preferred methods enable gang processing of the ICs into their respective package much like wafer level packaging while maximizing IC silicon wafer utilization and maintaining input/output pad compatibility with other devices such as resistors, capacitors, and printed circuit board substrates. Therefore, the methods of the present invention, extend the current art for IC packaging by providing a low cost solution to process chip scale packages in a wafer level format using printed circuit board processing.

Figure 4:
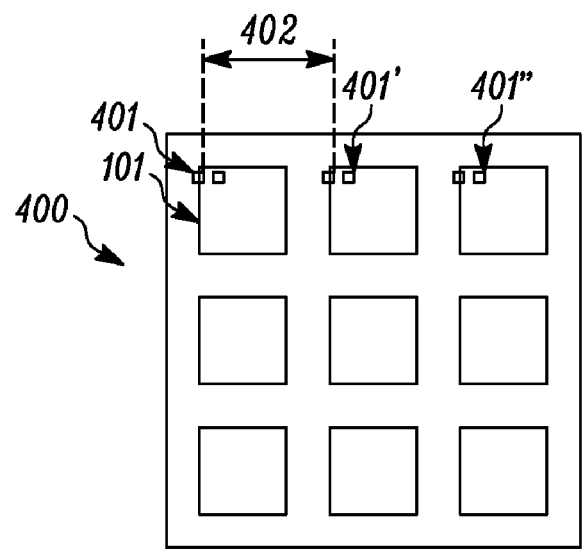
FIG. 4 is a diagram illustrating a plurality of IC chips cut from a silicon wafer and placed on a secondary substrate where secondary substrate is used for subsequent processing and does not become part of the finished IC and package in accordance with an embodiment of the invention.

FIG. 4 is a diagram illustrating an IC chip utilizing the manufacturing method where input/output leads can be extended beyond the die surface area in accordance with preferred methods of the invention. As will be described herein, the manufacturing process begins by cutting or "dicing" the IC chips in the silicon wafer and then placing each die 101 front-side down on a second substrate 400. Thus, the original silicon wafer (not shown) is reconstituted on the second substrate 400 for package processing. As will be evident to those skilled in the art, the second substrate 400 does not become an integral part of the package but only serves to facilitate subsequent processing. As such, the substrate 400 may be manufactured as a metal substrate such as aluminum or stainless steel, a glass material or a high temperature polymer. By way of example, the substrate 400 might be a polished aluminum where a release film is attached. Hence the surface area of the second substrate 400 is relatively greater than the surface area of the silicon wafer the chips were diced from. The greater surface area enables the chips that are reconstituted on 400 to have a greater space between them. Therefore, input output pads 401, 401', 401" will have a pitch 402. The pitch 402 is greater than the pitch 103 enabling more surface area for input/output connections of the packaged chip.

Figure 5:
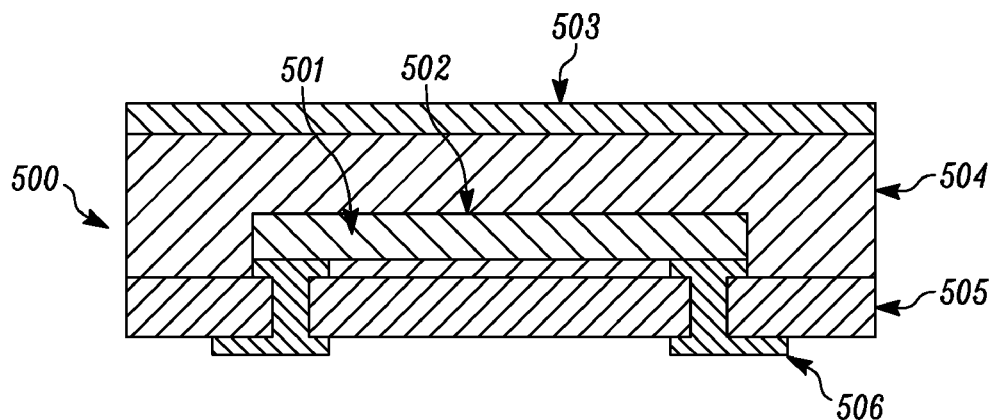
FIG. 5 is a diagram illustrating a cross-sectional view of the IC chip and package where input/output pads extend beyond the die surface area in accordance with an embodiment of the invention.

FIG. 5 is a diagram illustrating a cross-sectional view of the IC chip using an extended substrate. The chip package 500 includes the chip 501 which is positioned upside down so its bottom 502 faces toward the copper clad surface 503 of the substrate. As will be described herein, the package around the chip 501 is formed using a first epoxy material 504 which surrounds the bottom 502 and side 504 of the die 501. A second epoxy material 505 is used on the top 504 of the chip 501. One or more I/O pins 506 are used to access and distribute electric circuits on the IC within the package 500.

Figure 6A:
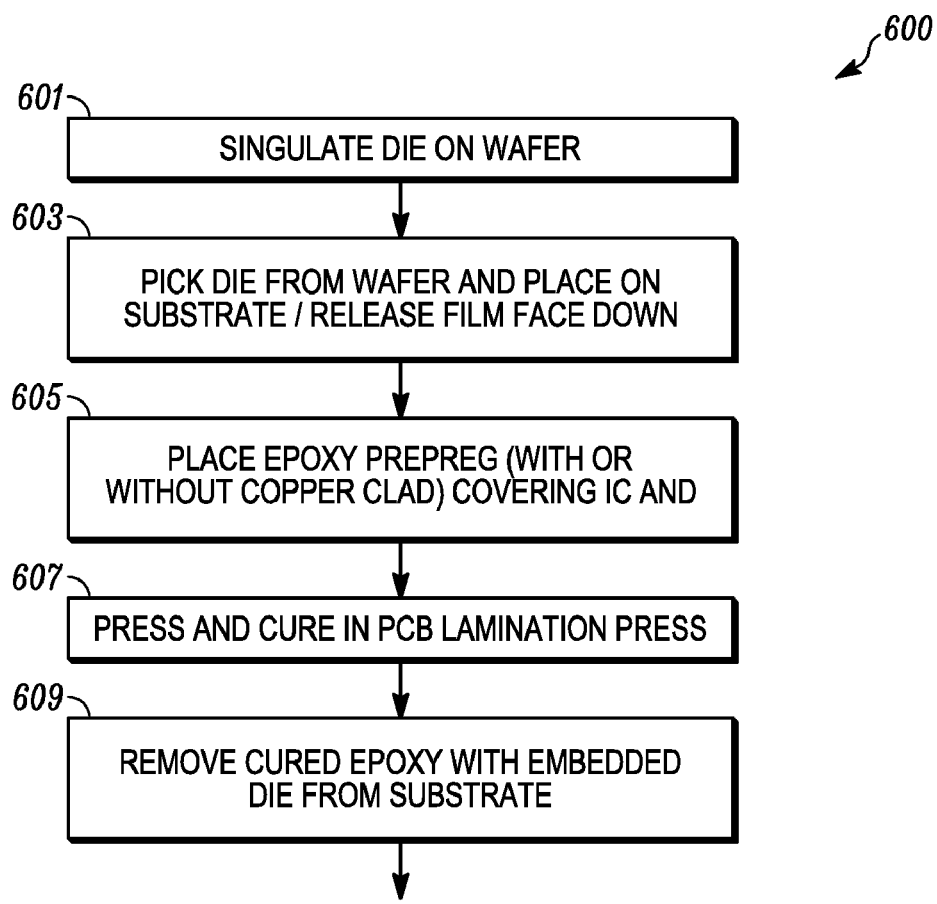
FIGS. 6A, 6B and 6C are flow chart diagrams illustrating the method for manufacturing the IC circuit packaging in accordance with an embodiment of the invention.
Figure 6B:
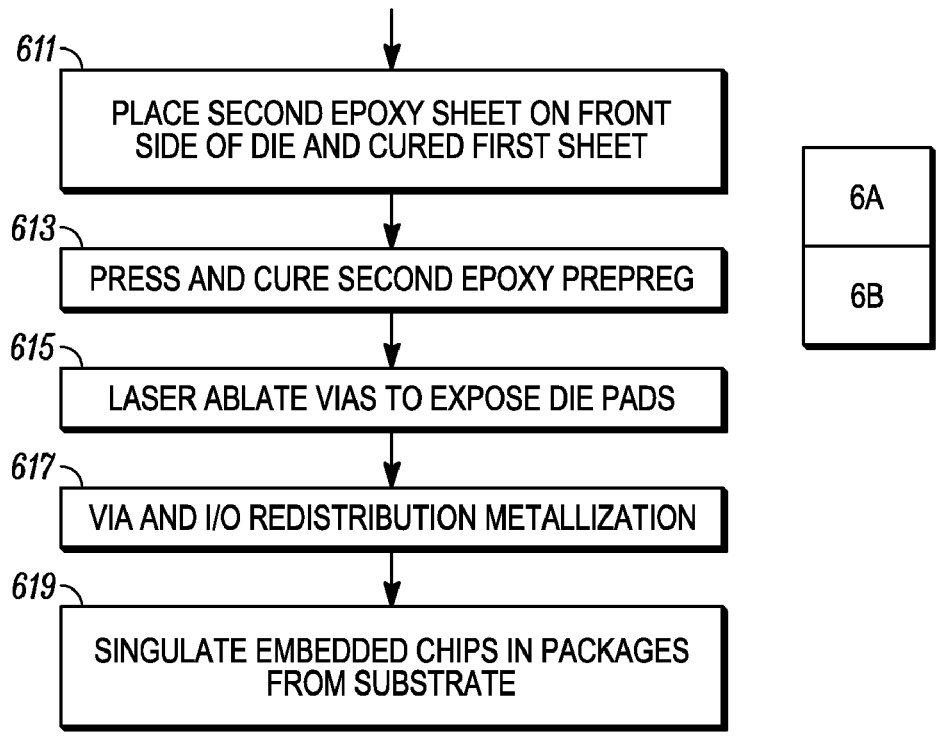
Figure 6C:
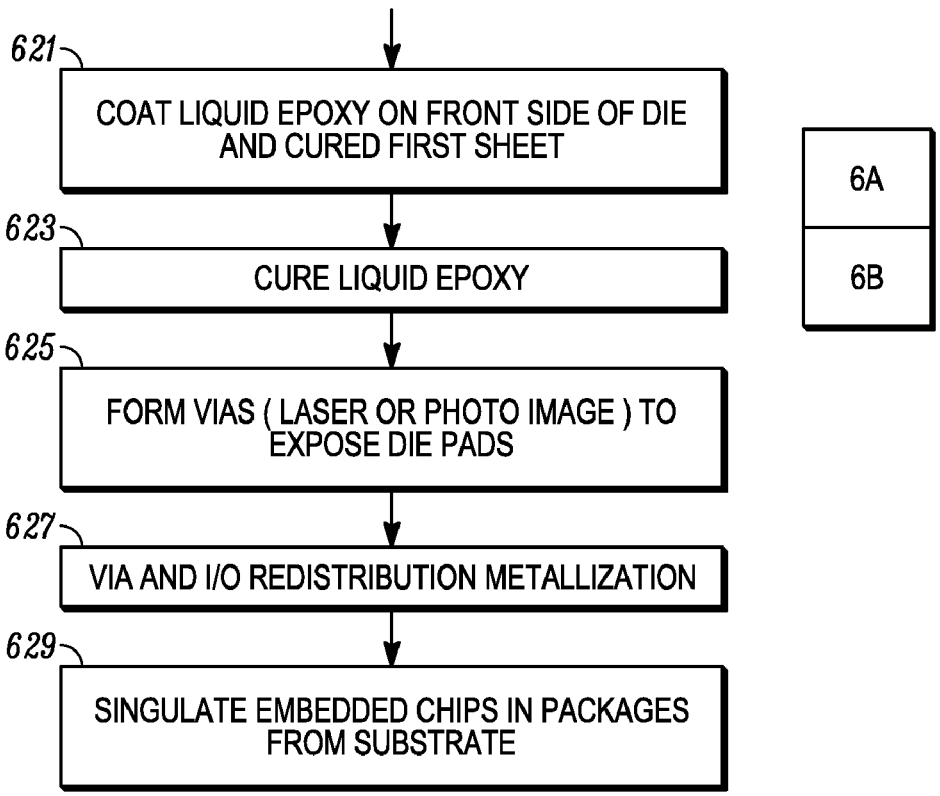

FIGS. 6A, 6B and 6C are flow chart diagrams illustrating the method for manufacturing the integrated circuit and packaging in accordance with an embodiment of the invention. As seen in FIG. 6A, the method for providing increased input/output pad pitch in IC package 600 includes the steps of initially singulating processed chips on a silicon wafer 601. As known to those skilled in the art, the processed chips include discrete semi-conductor components or IC type devices. The chips are picked from the wafer and placed 603 on the substrate and released and/or positioned face down such that the bottom of the die faces away from the substrate. Once all the die are in position the package can be formed for each die in mass where a first epoxy is placed 605 on a secondary substrate. The first epoxy is typically a pre-impregnated (prepreg) release film with or without copper clad that is used to cover the die. As well known in the art, pre-impregnation film includes a combination of mat, fabric, non-woven material or roving with resin that is typically cured at which point is ready for molding. Thus, after placing the chip on the substrate, an epoxy resin film such as resin coated copper foil (RCC) or 1080 prepreg is placed on top of the die 605 and press-cured 607 in a traditional printed circuit board (PCB) lamination press. The pressing process works to press the epoxy between the gaps between each die. Thereafter, the cured epoxy sheet with the embedded chips are removed 609 from the substrate.

In a first embodiment shown in the flow chart of FIG. 6B, a second sheet of epoxy prepreg clad with copper foil is placed 611 and then pressed 613 on the front side of the die and cured to harden. Vias are subsequently laser ablated 615 to expose the input/output pads on the IC. The ablated vias are plated with electroless/electroplated copper, and formed into circuit traces and pads using typical PCB process techniques 617. Thereafter, each of the embedded chips is singulated 619 from the substrate to provide individual finished IC packages.

In the second embodiment shown in the flow chart of FIG. 6C, either an epoxy prepreg (without copper clad) or a liquid dielectric (such as Dow Chemical CYCLOTENE or Polyimide) is applied 621 to the front side of the die and cured 623. Thereafter, vias are typically laser ablated or photo-defined 625 to expose the input/output pads on the IC chip and subsequent via connections. Input/output circuit trace and pad formation is accomplished 627 using traditional thin film metallization processing techniques for providing wired connections to components in the IC chip. The final step is to singulate 629 the array for each embedded IC using routing, scoring, sawing, or punching techniques.

Thus, the invention improves on the manufacturing process for integrated circuit packaging. Integrated circuits are cut from the wafer and placed with the die front-side down on a second substrate in a manner where more I/O chip area is available. Epoxy materials are then applied, input/output pads are accessed and wire connections made to the IC. Thus, the original die on the silicon wafer is reconstituted on the second substrate for package processing which does not become an integral part of the package and only serves to facilitate more rapid chip packaging. The invention as described herein enables low cost, very high density integrated circuit package manufacturing since the chip scale packaging and wafer level packaging processes are both used in combination.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

I claim:

1. A method for providing increased input/output (I/O) redistribution metallization in semiconductor packaging processes comprising the steps of:
   separating a processed silicon wafer into a plurality of individual die;
   positioning the die on a secondary substrate in a face down position for allowing an increased die I/O connection area;
   covering the die with at least one epoxy material to form a plurality of embedded die packages by covering a bottom portion of the die with a first pre-impregnated epoxy material and covering a top portion of the die with a second pre-impregnated epoxy material;
   exposing at least one pad on the die;
   connecting an I/O connection to at least one pad in the die I/O connection area; and
   separating each of the embedded die packages from the secondary substrate.

2. A method for providing increased I/O redistribution metallization as in claim 1, wherein the step of separating a processed silicon wafer includes the step of:
   singulating the die from the silicon wafer using a laser cutting process.

3. A method for providing increased I/O re-distribution metallization as in claim 1, wherein the first and second pre-impregnated epoxy material are a copper clad material.

4. A method for providing increased I/O redistribution metallization as in claim 1, wherein the step of exposing at least one pad on the die includes the step of:
   ablating at least one via through the at least one epoxy material.

5. A method for providing increased I/O redistribution metallization as in claim 4, wherein the step of ablating at least one via is performing using a laser cutting process.

6. A method for manufacturing a packaged integrated circuit (IC) where a plurality of the packaging steps on the integrated circuit are simultaneously performed on multiple ICs after wafer processing comprising the steps of:
   singulating each die from the semiconductor wafer;
   positioning the plurality of processed die on a secondary substrate in a face down position;
   covering each of the processed die on the secondary substrate with a first pre-impregnated epoxy to form an IC assembly;
   removing each IC assembly from the secondary substrate;
   covering a top side of the IC assembly with a second pre-impregnated epoxy;
   creating at least one via through the second pre-impregnated epoxy to expose at least one pad in the IC assembly;
   establishing a wire connection with the at least one pad; and
   singulating each IC assembly into an IC chip package.

7. A method for manufacturing a packaged IC as in claim 6, wherein the step of positioning the die on a secondary substrate comprises the step of:
   selecting a predetermined amount of die for the secondary substrate to achieve an optimal amount of input/output (I/O) surface area.

8. A method for manufacturing a packaged IC as in claim 6, wherein the first pre-impregnated epoxy and the second pre-impregnated epoxy include a copper based material.

9. A method for manufacturing a packaged IC as in claim 6, wherein the step of creating at least one via as in claim 1 further comprises the step of:
   using a laser cutting process to cut though the second pre-impregnated epoxy.

10. A method for increasing the amount of input/output (I/O) die surface area during an integrated circuit (IC) manufacturing process comprising the steps of:
    separating processed die from a silicon wafer into individual die units;
    positioning the individual die units on a secondary substrate in a face down position such that the I/O surface area on the secondary substrate is greater than that of the silicon wafer;
    covering a bottom of the individual die units on the secondary substrate with a first epoxy;
    pressing the first epoxy between each of the individual die units;
    curing the first epoxy to form a die assembly;
    removing each die assembly from the secondary substrate;
    covering a top of the die assembly with a second epoxy;
    pressing the second epoxy between each die assembly;
    curing the second epoxy for each die assembly;
    forming vias in the second epoxy to expose at least one die pad;
    forming a wire connection with the at least die pad to form an I/O for the die assembly; and
    separating each die assembly to form an individual IC package.

11. A method for increasing the amount of I/O die surface area as in claim 10, wherein the step of separating processed die from the silicon wafer utilizes a laser cutting process.

12. A method for increasing the amount of I/O die surface area as in claim 10, wherein the first epoxy and the second epoxy is pre-impregnated with a copper clad material.

13. A method for increasing the amount of I/O die surface area as in claim 10, wherein the first epoxy and the second epoxy are substantially liquid materials.

14. A method for increasing the amount of I/O die surface area as in claim 10, wherein the step of forming vias utilizes a laser ablating process.

* * * * *